(12) United States Patent
Lin et al.

(10) Patent No.: US 10,411,437 B2
(45) Date of Patent: Sep. 10, 2019

(54) CREATING ARBITRARY PATTERNS ON A 2-D UNIFORM GRID VCSEL ARRAY

(71) Applicant: APPLE INC., Cupertino, CA (US)

(72) Inventors: Chin Han Lin, Cupertino, CA (US); Weiping Li, Pleasanton, CA (US); Xiaofeng Fan, San Jose, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/180,041

(22) Filed: Nov. 5, 2018

(65) Prior Publication Data

US 2019/0089128 A1    Mar. 21, 2019

Related U.S. Application Data

(63) Continuation of application No. 15/844,662, filed on Dec. 18, 2017, now Pat. No. 10,153,614.

(Continued)

(51) Int. Cl.
*H01S 5/183* (2006.01)
*H01L 29/15* (2006.01)
(Continued)

(52) U.S. Cl.
CPC ........ *H01S 5/18327* (2013.01); *H01L 29/152* (2013.01); *H01S 5/026* (2013.01);
(Continued)

(58) Field of Classification Search
CPC .......................... H01S 5/18327; H01L 29/152
See application file for complete search history.

(56) References Cited

U.S. PATENT DOCUMENTS 6,026,110 A * 2/2000 Makino ............... H01S 5/1228
                                                  372/46.01
6,281,867 B2   8/2001 Kurematsu et al.
(Continued)

FOREIGN PATENT DOCUMENTS

JP    2000114656 A    4/2000
JP    2011003748 A    1/2011
(Continued)

OTHER PUBLICATIONS

International Applicatioin PCT/US2018/040531 Search Report dated Nov. 8, 2018.
(Continued)

*Primary Examiner* — Tuan N Nguyen
(74) *Attorney, Agent, or Firm* — Kligler & Associates

(57) ABSTRACT

An optoelectronic device includes a semiconductor substrate and an array of optoelectronic cells, formed on the semiconductor substrate. The cells include first epitaxial layers defining a lower distributed Bragg-reflector (DBR) stack; second epitaxial layers formed over the lower DBR stack, defining a quantum well structure; third epitaxial layers, formed over the quantum well structure, defining an upper DBR stack; and electrodes formed over the upper DBR stack, which are configurable to inject an excitation current into the quantum well structure of each optoelectronic cell. A first set of the optoelectronic cells are configured to emit laser radiation in response to the excitation current. In a second set of the optoelectronic cells, interleaved with the first set, at least one element of the optoelectronic cells, selected from among the epitaxial layers and the electrodes, is configured so that the optoelectronic cells in the second set do not emit the laser radiation.

8 Claims, 6 Drawing Sheets

Related U.S. Application Data

(60) Provisional application No. 62/552,406, filed on Aug. 31, 2017.

(51) Int. Cl.
*H01S 5/026* (2006.01)
*H01S 5/187* (2006.01)
*H01S 5/42* (2006.01)
*H01S 5/042* (2006.01)
*H01S 5/20* (2006.01)

(52) U.S. Cl.
CPC ............ *H01S 5/0425* (2013.01); *H01S 5/187* (2013.01); *H01S 5/18333* (2013.01); *H01S 5/18369* (2013.01); *H01S 5/423* (2013.01); *H01S 5/18308* (2013.01); *H01S 5/18311* (2013.01); *H01S 5/2063* (2013.01); *H01S 2301/176* (2013.01)

(56) References Cited

U.S. PATENT DOCUMENTS

| | | |
|---|---|---|
| 2003/0021326 A1 | 1/2003 | Liao et al. |
| 2007/0273957 A1 | 11/2007 | Zalevsky et al. |
| 2008/0279241 A1 | 11/2008 | Oki et al. |
| 2009/0010297 A1* | 1/2009 | Uchida ............... H01S 5/18344 372/50.124 |
| 2012/0249743 A1 | 10/2012 | Kim et al. |
| 2012/0293625 A1 | 11/2012 | Schneider et al. |
| 2015/0260830 A1 | 9/2015 | Ghosh et al. |
| 2016/0072258 A1 | 3/2016 | Seurin et al. |
| 2016/0164261 A1* | 6/2016 | Warren ................ H04N 5/2354 348/164 |

FOREIGN PATENT DOCUMENTS

| | | |
|---|---|---|
| WO | 2009153446 A2 | 12/2009 |
| WO | 2015078857 A1 | 6/2015 |

OTHER PUBLICATIONS

KR Application # 10-2013-0023877 office action dated Jan. 22, 2019.
TW Application # 107129761 office action dated Apr. 8, 2019.
U.S. Appl. No. 15/648,473 office action dated Jun. 24, 2019.

* cited by examiner

CREATING ARBITRARY PATTERNS ON A 2-D UNIFORM GRID VCSEL ARRAY

CROSS-REFERENCE TO RELATED APPLICATION

This application is a continuation of U.S. patent application Ser. No. 15/844,662, filed Dec. 18, 2017, which claims the benefit of U.S. Provisional Patent Application 62/552,406, filed Aug. 31, 2017, whose disclosure is incorporated herein by reference.

FIELD OF THE INVENTION

The present invention relates generally to optoelectronic devices, and particularly to devices configurable to emit patterned illumination.

BACKGROUND

Existing and emerging consumer applications have created an increasing need for real-time three-dimensional (3D) imagers. These imaging devices, also commonly known as depth sensors or depth mappers, enable the remote measurement of distance (and often intensity) of each point on a target scene—so-called target scene depth—by illuminating the target scene with one or more optical beams and analyzing the reflected optical signal.

Various methods are known in the art for generating light sources based on arrays of multiple light-emitting elements of optical radiation on a monolithic semiconductor substrate.

United States Patent Application Publication 2014/0211215, whose disclosure is incorporated herein by reference, describes an optical apparatus, which includes a beam source configured to generate an optical beam having a pattern imposed thereon. In one embodiment, an optoelectronic device comprises a semiconductor die on which a monolithic array of vertical-cavity surface-emitting laser (VCSEL) diodes is formed in a two-dimensional pattern that is not a regular lattice. The term "regular lattice" means a two-dimensional pattern in which the spacing between adjacent elements in the pattern (for example, between adjacent emitters in a VCSEL array) is constant and is synonymous with a periodic lattice. The pattern can be uncorrelated, in the sense that the auto-correlation of the positions of the laser diodes as a function of transverse shift is insignificant for any shift larger than the diode size. Random, pseudo-random, and quasi-periodic patterns are examples of such uncorrelated patterns.

SUMMARY

Embodiments of the present invention that are described hereinbelow provide improved methods for fabricating patterned light sources and light sources that can be produced by such methods.

There is therefore provided, in accordance with an embodiment of the invention, an optoelectronic device, including a semiconductor substrate and an array of optoelectronic cells, which are formed on the semiconductor substrate. The cells include first epitaxial layers defining a lower distributed Bragg-reflector (DBR) stack; second epitaxial layers formed over the lower DBR stack, defining a quantum well structure; third epitaxial layers, formed over the quantum well structure, defining an upper DBR stack; and electrodes formed over the upper DBR stack, which are configurable to inject an excitation current into the quantum well structure of each optoelectronic cell. The array includes a first set of the optoelectronic cells that are configured to emit laser radiation in response to the excitation current and a second set of the optoelectronic cells, interleaved with the first set, in which at least one element of the optoelectronic cells, selected from among the epitaxial layers and the electrodes, is configured so that the optoelectronic cells in the second set do not emit the laser radiation.

In a disclosed embodiment, the array is a regular array, while the first set of the optoelectronic cells are arranged in an uncorrelated pattern within the array.

In one embodiment, the second set of the optoelectronic cells include implanted ions in the upper DBR stack, which increase an electrical resistance of the upper DBR stack by an amount sufficient to reduce the excitation current injected into the quantum well structure to below a threshold required for emitting laser radiation.

In other embodiments, the electrodes of the second set of the optoelectronic cells are configured so as not to inject the excitation current into the quantum well structure. In one such embodiment, the optoelectronic cells include an isolation layer between the epitaxial layers and the electrodes, and a part of the isolation layer is etched away in the first set of the optoelectronic cells and is not etched in the second set of the optoelectronic cells, so that the excitation current is not injected into the quantum well structure of the second set of the optoelectronic cells. In another embodiment, the device includes conductors configured to feed electrical current to the optoelectronic cells, and an isolation layer, which isolates the electrodes of the second set of the optoelectronic cells from the conductors, so that the electrical current is not fed to the electrodes of the second set of the optoelectronic cells.

Additionally or alternatively, the device includes an isolation layer formed between the lower and upper DBR stacks, wherein the isolation layer is etched out of an area of the quantum well structure in the first set of the optoelectronic cells and is not etched out of the second set of the optoelectronic cells.

There is also provided, in accordance with an embodiment of the invention, a method for manufacturing an optoelectronic device. The method includes depositing first epitaxial layers on a semiconductor substrate to define a lower distributed Bragg-reflector (DBR) stack. Second epitaxial layers are deposited over the first epitaxial layers to define a quantum well structure. Third epitaxial layers are deposited over the second epitaxial layers to define an upper DBR stack. The epitaxial layers are etched to define an array of optoelectronic cells. Electrodes are deposited over the third epitaxial layers electrodes and are configurable to inject an excitation current into the quantum well structure of each optoelectronic cell so as to cause a first set of the optoelectronic cells to emit laser radiation in response to the excitation current. At least one element, selected from among the epitaxial layers and the electrodes, of a second set the optoelectronic cells, which is interleaved with the first set, is configured so that the optoelectronic cells in the second set do not emit the laser radiation.

The present invention will be more fully understood from the following detailed description of the embodiments thereof, taken together with the drawings in which:

DETAILED DESCRIPTION OF EMBODIMENTS

Overview

Light sources emitting multiple beams are used, inter alia, in 3-D (three-dimensional) mapping applications based on optical triangulation. As described in the above-mentioned United States Patent Application Publication 2014/0211215, it is advantageous to use a light source that projects a random or pseudo-random pattern on the target to be mapped. A desirable emitter for such a light source is a VCSEL (vertical-cavity surface-emitting laser) array, due to low power consumption, high reliability, and good beam quality. A random or pseudo-random pattern of emitters in a VCSEL array can be generated by a corresponding photolithographic mask. The non-periodic distribution of the emitters, however, may lead to reduced control over the photoresist pattern CD (critical dimensions), as well as poor etch uniformity due to uneven etch load effects.

The embodiments of the present invention that are described herein address the above limitations by fabricating a VCSEL array on a uniform grid, and disabling individual emitters. The disabled emitters can be interleaved with the enabled (operating) emitters in substantially any desired pattern, for example in a pseudo-random or otherwise uncorrelated pattern. The disclosed embodiments selectively disable emitters using modifications in the VCSEL fabrication process, for example by modifying the epitaxial layers or the electrodes of the VCSELs. As the design is based on a uniform grid, it can be manufactured reliably using standard photolithographic methods.

System Description

Figure 1:
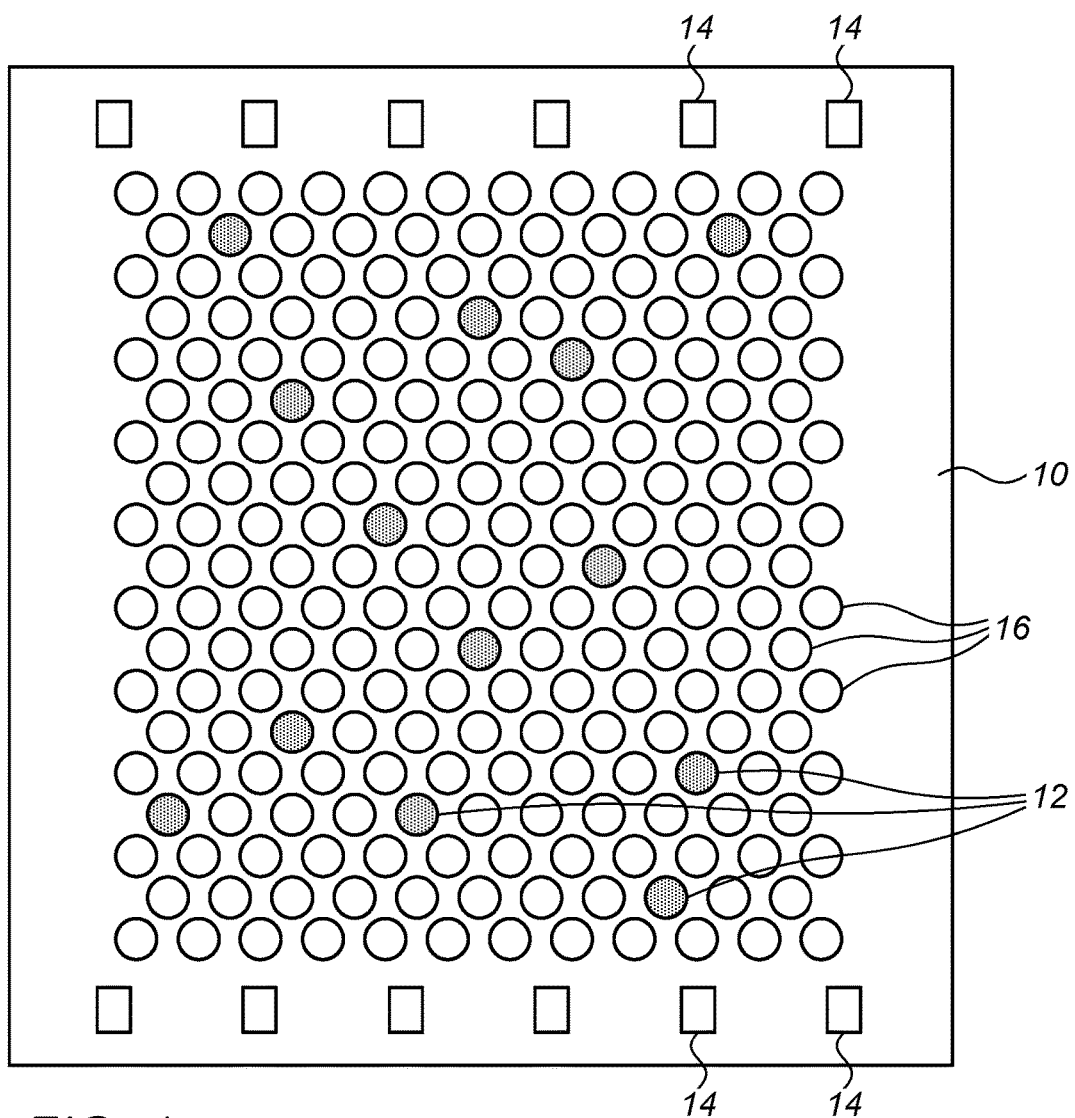
FIG. 1 is a schematic top view of an optoelectronic device comprising a semiconductor die on which a monolithic array of VCSELs has been formed in a two-dimensional pattern, in accordance with an embodiment of the present invention.

FIG. 1 is a schematic top view of an optoelectronic device comprising a semiconductor die 10 on which a monolithic array of enabled optoelectronic cells 12, such as VCSELs, has been formed in an uncorrelated two-dimensional pattern, in accordance with an embodiment of the present invention. The array is formed on the semiconductor substrate by the same sort of photolithographic methods as are used to produce VCSEL arrays that are known in the art, with suitable thin film layer structures forming the VCSELs, and conductors providing electric power and ground connections from contact pads 14 to VCSELs 12 in the array.

The sort of uncorrelated pattern of enabled VCSELs 12 is produced using substantially the same processes as are used in fabricating a regular array (i.e., an array in the form of a regular lattice) of VCSEL-like cells. In contrast to a conventional regular array, however, only VCSELs 12 are selectively enabled, while disabling the remaining VCSEL-like cells. These disabled cells are referred to herein as "dummy cells 16," since they are nearly identical in structure to VCSELs 12 but are incapable of laser emission due to thin film layer properties that are configured in the manufacturing process. In the following, the terms "disabling" and "disabled" are used synonymously with "not enabling" and "not enabled", respectively.

The ability to create an array of operating emitters in substantially any desired pattern, for example in a pseudo-random or otherwise uncorrelated pattern, based on a regular array of cells, has several advantages:

an improved dry etch uniformity is achieved by minimizing so-called etch loading effects;

a tighter control of photoresist CD is achieved due to the periodical structure of the uniform grid; and a more uniform temperature distribution of die 10 can be achieved, leading to a better optical power uniformity, by filling the trenches between cells with a resin, such as polyimide.

FIGS. 2-7 are schematic sectional views of enabled and disabled VCSELs. Each figure compares an enabled VCSEL (that can be used as the basis for enabled VCSELs 12), in a figure labeled by "a", to a disabled VCSEL (as a possible basis for dummy cells 16), in a figure labeled by "b". As the enabled and disabled VCSELs share most of the same elements, a detailed description of an enabled VCSEL is given with reference to FIG. 2a, below.

Figure 2A:
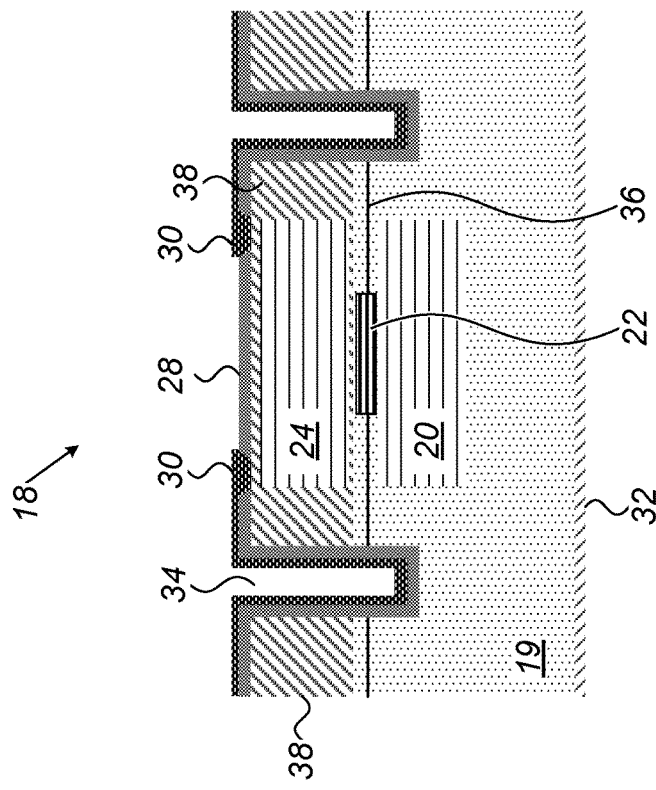
FIGS. 2a-b are schematic sectional views of an enabled VCSEL and a disabled VCSEL, in accordance with an embodiment of the present invention.
Figure 2B:
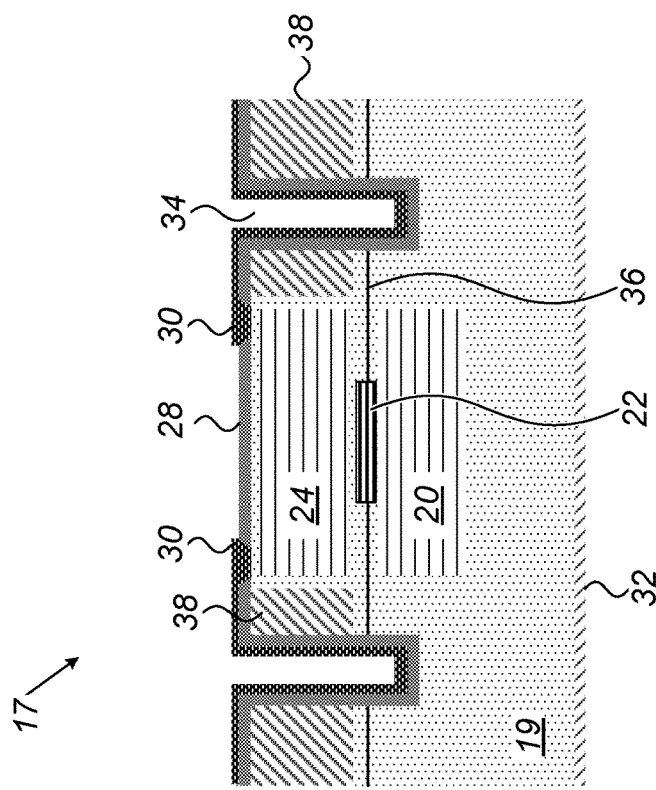

FIGS. 2a-b are schematic sectional views of an enabled VCSEL 17 and a disabled VCSEL 18, in accordance with an embodiment of the present invention.

Enabled VCSEL 17 in FIG. 2a is formed on a semiconductor substrate 19. Epitaxial semiconductor layers of a VCSEL (a lower n-type distributed Bragg-reflector [n-DBR] stack 20, a quantum well structure 22, and an upper p-DBR stack 24) are deposited over an area of semiconductor substrate 19. Between n-DBR stack 20 and p-DBR stack 24 a confinement layer 36, typically Al-oxide, is formed and patterned. Following the deposition of p-DBR stack 24, an isolation layer 28 is deposited and patterned, and one or more p-electrodes 30 and n-electrodes 32 are deposited and patterned. Isolation trenches 34 are etched to define the array of VCSELs and to isolate neighboring VCSELs. Additionally, an isolation implant 38, such as a proton implant, may be deposited adjacent to p-DBR stack 24 and quantum well structure 22 for increased isolation between neighboring VCSELs.

Disabled VCSEL 18 in FIG. 2b differs from enabled VCSEL 17 in that in the disabled VCSEL, isolation implant 38 extends into p-DBR stack 24 and possibly into quantum well structure 22. Due to the lattice damage caused by the ion implantation, the resistance of the implanted layers increases from the non-implanted state, lowering the excitation current injected into quantum well structure 22 to below the threshold required for emitting laser radiation. As a result, the VCSEL is disabled and will not emit laser radiation.

Disabling of VCSEL 18 is achieved in the fabrication process by a modification of the photomask responsible for defining the lateral distribution of the deposition of isolation implant 38 so as to permit implantation ions to reach p-DBR stack 24 and possibly quantum well structure 22.

Figure 3A:
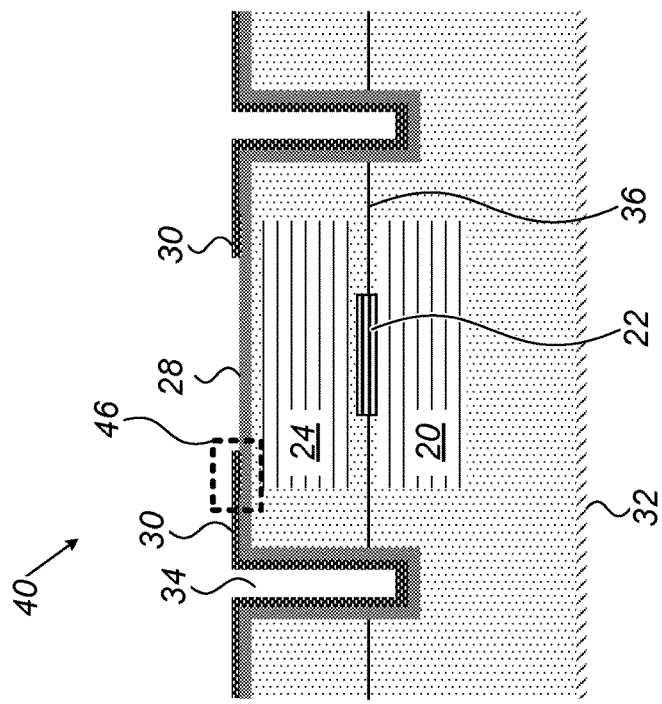
FIGS. 3a-b are schematic sectional views of an enabled VCSEL and a disabled VCSEL, in accordance with another embodiment of the present invention.
Figure 3B:
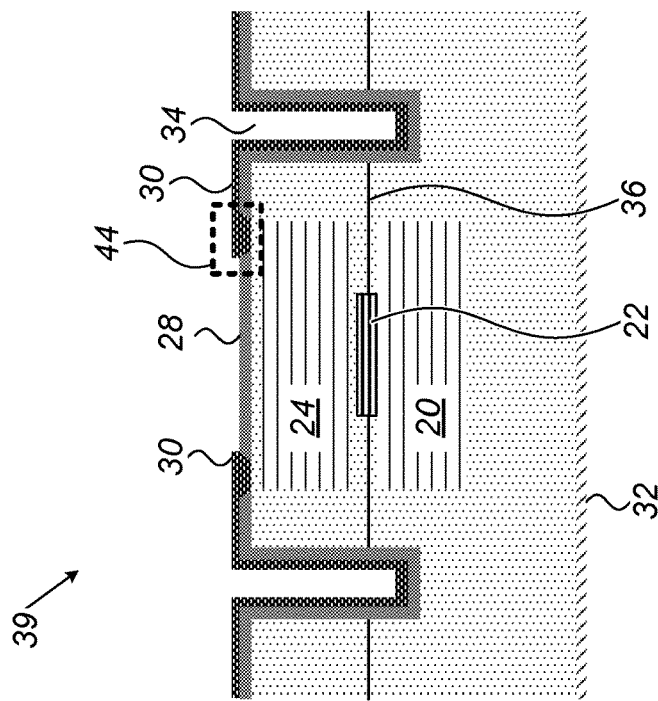

FIGS. 3*a-b* are schematic sectional views of an enabled VCSEL 39 and a disabled VCSEL 40, in accordance with another embodiment of the present invention. Enabled VCSEL 39 is substantially similar to enabled VCSEL 17 of FIG. 2*a*, except that the present embodiment does not necessarily comprise isolation implant 38 for isolating neighboring VCSELs. Disabling VCSEL 40 is accomplished by preventing the injection of excitation current into p-DBR stack 24 and quantum well structure 22. The differences between enabled VCSEL 39 and disabled VCSEL 40 in three alternative embodiments of the present invention are shown in FIGS. 4-6. These figures refer to FIGS. 3*a-b*, and show an area 44 (marked by a dotted line) for enabled VCSEL 39 and an area 46 (marked by a dotted line) for disabled VCSEL 40.

Figure 4B:
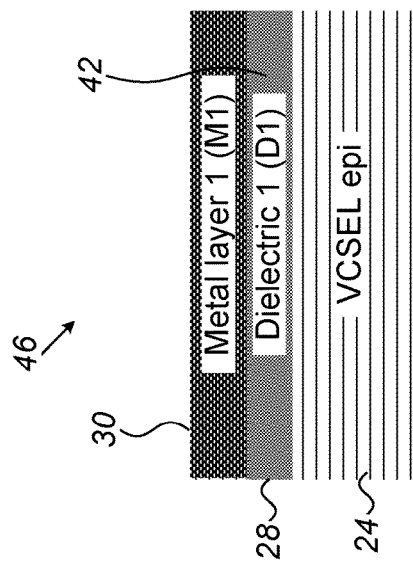
FIGS. 4a-b are schematic sectional views of areas of enabled and disabled VCSELs, in accordance with yet another embodiment of the present invention.
Figure 4A:
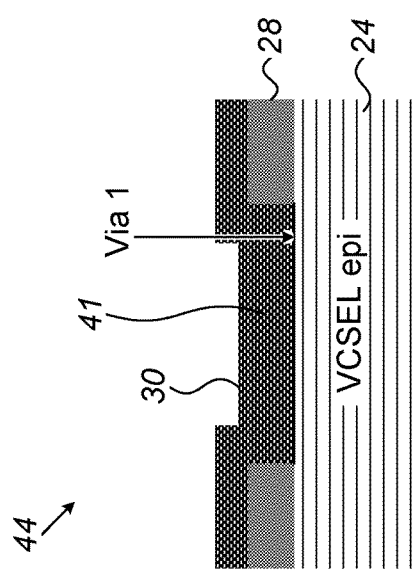

FIGS. 4*a-b* are schematic sectional views of areas 44 and 46 of enabled and disabled VCSELs 39 and 40 of FIGS. 3*a-b*, respectively, in accordance with an embodiment of the present invention.

In enabled VCSEL 39 an electrical contact between p-electrode 30 and p-DBR stack 24 is produced by etching a via in a location 41 in isolation layer 28 prior to deposition of the metal layer (M1) that serves as the p-electrode, thus enabling the flow of excitation current from the p-electrode to the p-DBR stack and further to quantum well structure 22. In disabled VCSEL 40 no via is etched, as is shown by contiguous isolation layer 28 in a location 42, thus preventing the flow of excitation current from p-electrode 30 into p-DBR stack 24 and further to quantum well structure 22.

Disabling of VCSEL 40 is achieved in the fabrication process by a modification of the photomask responsible for delineating the etch of isolation layer 28 so as not to etch a via in location 42.

Figure 5B:
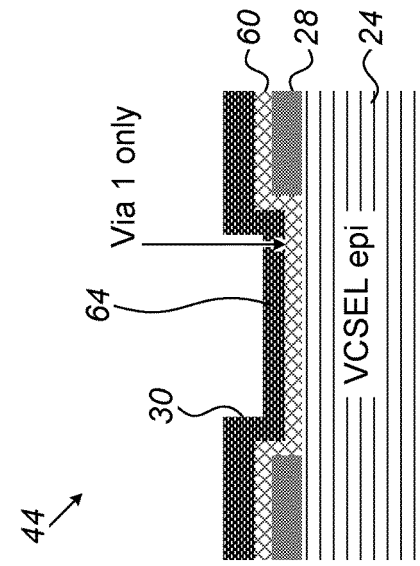
FIGS. 5a-b are schematic sectional views of areas of enabled and disabled VCSELs, in accordance with a further embodiment of the present invention.
Figure 5A:
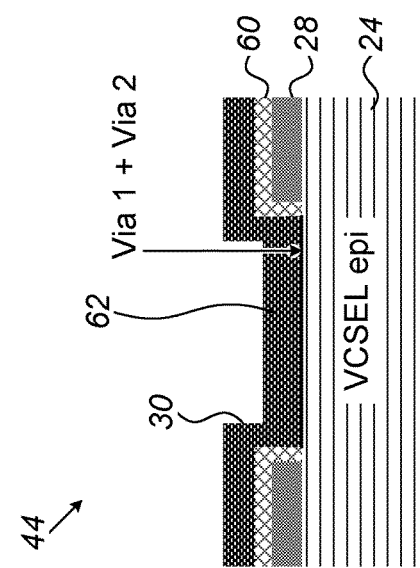

FIGS. 5*a-b* are schematic sectional views of areas 44 and 46 of enabled and disabled VCSELs 39 and 40 of FIGS. 3*a-b*, respectively, in accordance with another embodiment of the present invention.

In both enabled VCSEL 39 and disabled VCSEL 40 a via is etched in isolation layer 28 in locations 62 and 64, respectively. A second isolation layer 60 is deposited over isolation layer 28, and a via is etched in enabled VCSEL 39 in location 62, whereas no via is etched in disabled VCSEL 40 in location 64. p-electrode 30 is deposited over second isolation layer 60, and the via etched in location 62 enables electrical contact between the p-electrode and p-DBR stack 24, thus enabling the flow of excitation current from the p-electrode to the p-DBR stack and further to quantum well structure 22. However, no electrical contact is established between p-electrode 30 and p-DBR stack 24 of disabled VCSEL 40 due to contiguous second isolation layer 60 in location 64, thus preventing the flow of excitation current from the p-electrode into the p-DBR stack and further to quantum well structure 22.

Disabling of VCSEL 40 is achieved in the fabrication process by a modification of the photomask responsible for delineating the etch of isolation layer 60 so as to prevent the etching of a via in location 64.

Figure 6B:
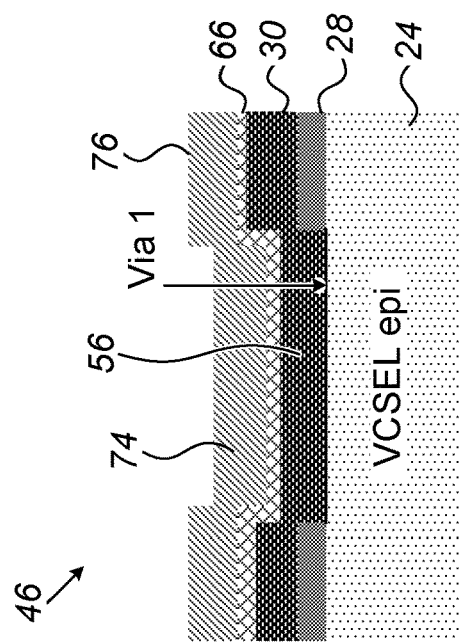
FIGS. 6a-b are schematic sectional views of areas of enabled and disabled VCSELs, in accordance with still another embodiment of the present invention.
Figure 6A:
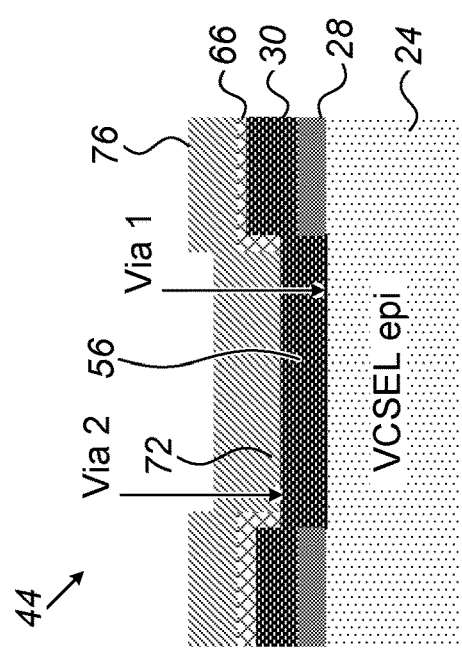

FIGS. 6*a-b* are schematic sectional views of areas 44 and 46 of enabled and disabled VCSELs 39 and 40 of FIGS. 3*a-b*, respectively, in accordance with yet another embodiment of the present invention.

In both enabled VCSEL 39 and disabled VCSEL 40 an electrical contact between p-electrode 30 and p-DBR stack is generated by etching a via in a location 41 in isolation layer 28, similarly to enabled VCSEL of FIG. 4*a*. A second isolation layer 66 is deposited over p-electrode (as opposed to depositing over isolation layer 28, as in FIGS. 5*a-b*). A via is etched in second isolation layer 66 in a location 72, but no via is etched in a location 74. A conducting layer 76 is deposited on second isolation layer 66 for feeding electrical current to the array of optoelectronic cells. Due to the via etched in location 72, conducting layer 76 is in electrical contact with p-electrode 30, and thereby with p-DBR stack 24, enabling the flow of excitation current from the second metal layer to the p-DBR stack and further to quantum well structure 22. However, due to contiguous second isolation layer 66 in location 74, p-electrode 30 of disabled VCSEL 40 is isolated from conducting layer 76, thus preventing feeding of electrical current to the p-electrode.

Disabling of VCSEL 40 is achieved in the fabrication process by a modification of the photomask responsible for delineating the etch of isolation layer 60 so as to prevent the etching of a via in location 74.

Figure 7A:
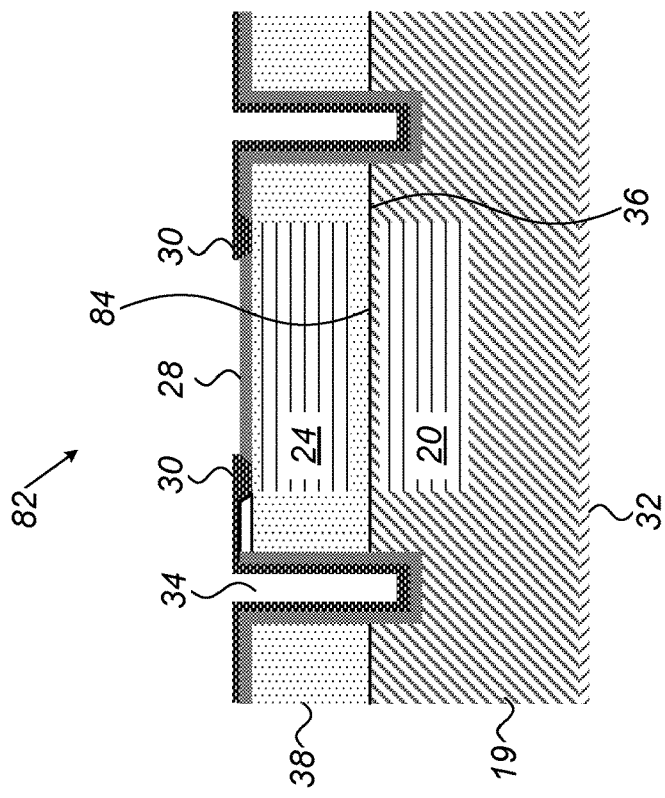
FIGS. 7a-b are schematic sectional views of an enabled VCSEL and a disabled VCSEL, in accordance with an alternative embodiment of the present invention.
Figure 7B:
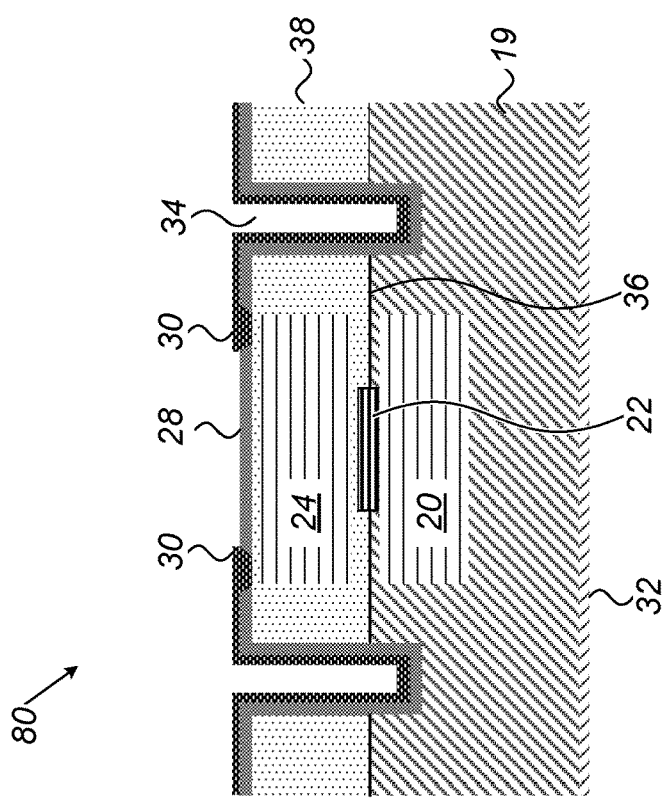

FIGS. 7*a-b* are schematic sectional views of an enabled VCSEL 80 and a disabled VCSEL 82, in accordance with an embodiment of the present invention. Enabled VCSEL 80 is substantially similar to enabled VCSEL 39 of FIG. 3*a*. Disabled VCSEL 82 differs from enabled VCSEL 80 in that confinement layer 36 is not etched in location 84, preventing the growth of quantum well structure 22.

Disabling of VCSEL 80 is achieved in the fabrication process by a modification of the photomask so as to prevent the etch of confinement layer 36 in location 84.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optoelectronic device, comprising:
    a semiconductor substrate; and
    an array of optoelectronic cells, which are formed on the semiconductor substrate and comprise:
        first epitaxial layers defining a lower distributed Bragg-reflector (DBR) stack;
        second epitaxial layers formed over the lower DBR stack, defining a quantum well structure;
        third epitaxial layers, formed over the quantum well structure, defining an upper DBR stack;
        an isolation layer formed between the lower and upper DBR stacks; and
        electrodes formed over the upper DBR stack, which are configurable to inject an excitation current into the quantum well structure of each optoelectronic cell,
        wherein the array comprises a first set of the optoelectronic cells that are configured to emit laser radiation in response to the excitation current and a second set of the optoelectronic cells, interleaved with the first set, wherein the isolation layer is etched out of an area of the quantum well structure in the first set of the optoelectronic cells and is not etched out of the second set of the optoelectronic cells so that the optoelectronic cells in the second set do not emit the laser radiation.

2. The optoelectronic device of claim 1, wherein the array is a regular array, while the second set of the optoelectronic cells is selected so that the first set of the optoelectronic cells defines an uncorrelated pattern within the array.

3. The optoelectronic device of claim 1, wherein the lower DBR stack comprises an n-type DBR, and the upper DBR stack comprises a p-type DBR.

4. The optoelectronic device of claim 1, wherein neighboring optoelectronic cells in the array are isolated from one another by isolation trenches.

5. A method for manufacturing an optoelectronic device, the method comprising:
   depositing first epitaxial layers on a semiconductor substrate to define a lower distributed Bragg-reflector (DBR) stack;
   depositing second epitaxial layers over the first epitaxial layers to define a quantum well structure;
   depositing third epitaxial layers over the second epitaxial layers to define an upper DBR stack;
   etching the epitaxial layers to define an array of optoelectronic cells, including a first set of the optoelectronic cells and a second set of the optoelectronic cells, which is interleaved with the first set;
   depositing an isolation layer between the lower and upper DBR stacks;
   depositing over the third epitaxial layers electrodes configurable to inject an excitation current into the quantum well structure of each optoelectronic cell so as to cause the optoelectronic cells in the first set to emit laser radiation in response to the excitation current; and
   etching the isolation layer out of an area of the quantum well structure in the first set of the optoelectronic cells while not etching the isolation layer out of the second set of the optoelectronic cells, so that the optoelectronic cells in the second set do not emit the laser radiation.

6. The method of claim 5, wherein the array is a regular array, and wherein physically modifying the at least one element comprises selecting the second set of the optoelectronic cells so that the first set of the optoelectronic cells defines an uncorrelated pattern within the array.

7. The method of claim 5, wherein the lower DBR stack comprises an n-type DBR, and the upper DBR stack comprises a p-type DBR.

8. The method of claim 5, and comprising etching isolation trenches between neighboring optoelectronic cells in the array.

* * * * *